US012750947B2

(12) United States Patent
Ma et al.

(10) Patent No.: US 12,750,947 B2
(45) Date of Patent: Sep. 29, 2026

(54) METAL INTEGRATED SUSPENDED LINE (MISL) CIRCUITS

(71) Applicant: Tianjin University, Tianjin (CN)

(72) Inventors: Kaixue Ma, Tianjin (CN); Yi Wu, Tianjin (CN); Ming Yin, Tianjin (CN)

(73) Assignee: Tianjin University, Tianjin (CN)

( * ) Notice: Subject to any disclaimer, the term of this patent is extended or adjusted under 35 U.S.C. 154(b) by 71 days.

(21) Appl. No.: 18/670,886

(22) Filed: May 22, 2024

(65) Prior Publication Data

US 2025/0024585 A1 Jan. 16, 2025

(30) Foreign Application Priority Data

Jul. 13, 2023 (CN) ......................... 202310860471.9

(51) Int. Cl.

*H05K 1/02* (2006.01)
*H01P 1/202* (2006.01)
*H01P 3/12* (2006.01)

(52) U.S. Cl.

CPC ........... *H05K 1/0216* (2013.01); *H01P 1/202* (2013.01); *H01P 3/12* (2013.01)

(58) Field of Classification Search

CPC ........ H05K 1/0216; H05K 1/02; H01P 1/202; H01P 3/12

See application file for complete search history.

(56) References Cited

U.S. PATENT DOCUMENTS

2015/0054593 A1* 2/2015 Wang ...................... H01P 5/107 333/26

FOREIGN PATENT DOCUMENTS

| | | | | | |
|---|---|---|---|---|---|
| CN | 117320272 | A | * | 12/2023 | H05K 1/14 |
| CN | 117998733 | A | * | 5/2024 | H05K 1/0218 |
| WO | WO-2007149046 | A1 | * | 12/2007 | H01Q 1/2283 |

* cited by examiner

*Primary Examiner* — Andrea Lindgren Baltzell
*Assistant Examiner* — Kimberly E Glenn
(74) *Attorney, Agent, or Firm* — Hemisphere Law, PLLC

(57) ABSTRACT

A metal-integrated suspended line includes multiple metal substrates stacked from top to bottom and connected by rivets or screws to form a self-encapsulating structure. At least two of the metal substrates except a top metal substrate and a bottom metal substrate are spaced apart from each other, and each of the at least two metal substrates defines an air-filled hollow cavity. One of the metals substrates disposed between hollow cavities of the two metal substrates is provided with a circuit structure. The metal-integrated suspended line can give full play to advantages of all-metal-integrated suspended line platform, and achieve the circuit structure with high Q value, good electromagnetic shielding and excellent heat dissipation performance; meanwhile, a slotline structure can be designed by etching slots on the metal substrate disposed between the two hollow cavities of two of the at least two metal substrates.

2 Claims, 2 Drawing Sheets

METAL INTEGRATED SUSPENDED LINE (MISL) CIRCUITS

TECHNICAL FIELD

The present disclosure relates to the technical field of radiofrequency microwave circuits, in particular to a metal-integrated suspended line.

BACKGROUND

In modern communication systems, a transmission line is an important part of the microwave millimeter wave circuits, the size, loss and other characteristics of the transmission line are directly related to the performance of the entire circuit and system. A traditional dielectric suspended line has advantages of small loss and weak dispersion. The dielectric integrated suspended line possesses self-encapsulation characteristics. In recent years, transmission line types with miniaturization, high integration and high stability are increasingly becoming hot focuses in transmission line research, and circuits based on the design of the dielectric integrated suspended line have been successfully applied to designs of a variety of microwave devices. However, due to its relatively small quality factor (Q) value, the traditional dielectric integrated suspended line is unable to meet the high Q value requirements of certain devices, such as narrow-band filters and multiplexers which need to use a very high Q value of the transmission line structure. At the same time, in some active devices, the heat dissipation effect of the dielectric integrated suspended line also needs to be improved.

SUMMARY

To solve problems in the related art such as those mentioned above, the present disclosure provides a metal-integrated suspended line (MISL), based on a multilayer metal integrated suspended line platform, utilizing a multilayer metal structure to design multilayer circuits. The metal-integrated suspended line utilizes a multilayer all-metal-integrated suspended line platform to design a metal transmission line with high Q value and a metal resonator, thereby realizing the characteristics of high Q value, self-encapsulation, and easy integration.

The present disclosure is realized in this way, a metal suspended line includes multiple metal substrates stacked from top to bottom and connected by metallized through holes to form a self-encapsulated structure. At least two of the multiple metal substrates except a top metal substrate located at a top of the multiple metal substrates and a bottom metal substrate located at a bottom of the multiple metal substrates are spaced apart from each other and each of the at least two medal substrates defines an air-filled hollow cavity. The metal substrate disposed between the two hollow cavities of two of the at least two metal substrates is provided with a circuit structure.

In an embodiment, multiple metal substrates are connected by countersinking, riveting, or soldering to form the self-encapsulating structure.

In an embodiment, the two hollow cavities of two of the at least two metal substrates are rectangular cavities with same or different areas.

In an embodiment, each metal substrate defines multiple metallized through holes.

In an embodiment, the circuit structure includes a suspended transmission line and a coaxial feeder connected to the suspended transmission line. The suspended transmission line is located in an air cavity defined on the metal substrate provided with the circuit structure, and the coaxial feeder is disposed on two ends or a side of the air cavity.

In an embodiment, the circuit structure includes multiple coaxial-like line filters. The coaxial-like line filters are spaced apart from each other, and disposed on a side of an air cavity defined on the metal substrate provided with the circuit structure.

In an embodiment, an end of each of the multiple coaxial-like line filters is connected to an inner wall of the metal substrate surrounding the air cavity in a lengthwise direction of the air cavity and another end of each of the multiple coaxial-like line filters opposite to the end of each of the multiple coaxial-like line filter is spaced apart from another inner wall of the metal substrate surrounding the air cavity in the lengthwise direction of the air cavity.

In an embodiment, a feed waveguide is provided on a top of the top metal substrate.

In an embodiment, multiple metal substrates have same or different thicknesses.

According to the present disclosure, a multilayer self-encapsulated structure is formed through a multilayer metal-integrated suspended line circuit technology, a circuit design is carried out on the suspended line layer, high-performance radio frequency (RF), microwave, and terahertz circuits are realized by utilizing the low-loss and high-Q value characteristics of the metal structure. This circuit layout can fully utilize the advantages of the all-metal-integrated line suspended platform to realize a high-Q value, great electromagnetic shielding and excellent heat dissipation circuit structure. The slotline structure can also be designed by etching slots on the metal substrate disposed between the two hollow cavities of two of the at least two metal substrates.

In addition, based on this platform, integrating with other active and passive circuits can be simple. Each metal substrate can be processed independently and finally integrated by riveting or soldering.

DETAILED DESCRIPTION OF EMBODIMENTS

In order to make the objects, technical solutions and advantages of the embodiments of the present disclosure clearer, the technical solutions in the embodiments of the present disclosure will be described clearly and completely in the following in combination with the embodiments of the present disclosure. Apparently, the described embodiments are a part of the embodiments of the present disclosure and not all of the embodiments.

The present disclosure focuses on the realization of an all-metal integrated suspended line in order to achieve high Q value and good heat dissipation characteristics.

Figure 1:
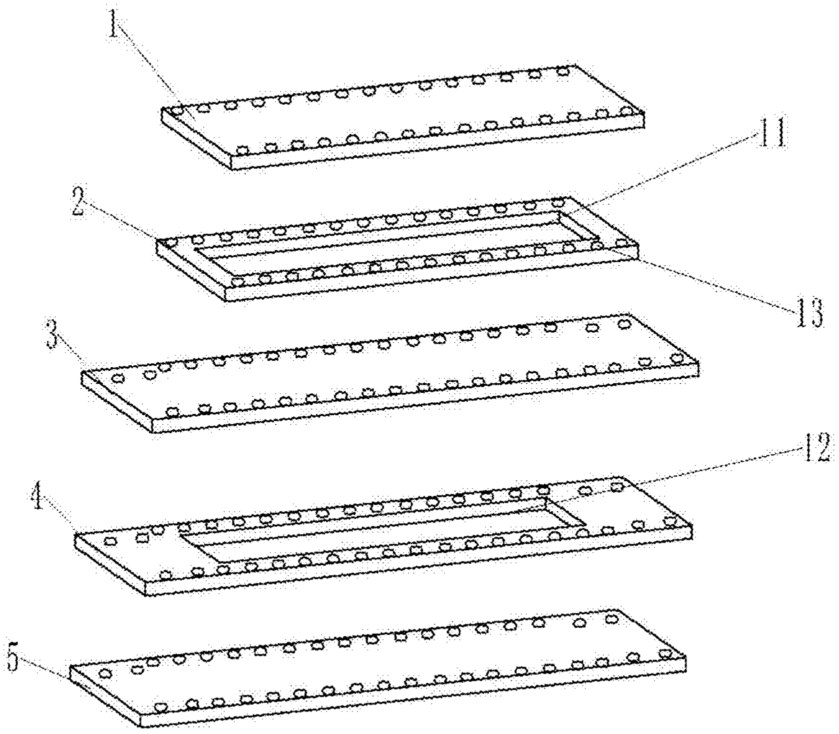
FIG. 1 illustrates a schematic diagram of a metal-integrated suspended line according to an embodiment of the present disclosure.

FIG. 1 illustrates a metal-integrated suspended line of an embodiment of the present disclosure, the metal-integrated suspended line includes multiple metal substrates arranged in sequence from top to bottom, each metal substrate is a metal structure. The metal substrates include a metal substrate 1, a metal substrate 2, a metal substrate 3, a metal substrate 4, and a metal substrate 5 sequentially arranged in that order from top to bottom. The metal substrate 2 and the metal substrate 4 are partially excised to define an air-filled first hollow cavity 11 and an air-filled second hollow cavity 12, respectively. The metal substrate 3 is for main circuit designing. Each metal substrate defines multiple metallized through holes 13, and connecting parts penetrate all the metal substrates by passing through the metallized through holes 13 to form a closed cavity structure. The multiple metal substrates are connected through countersinking, riveting, or soldering to form a self-encapsulated structure. In an alternative embodiment, the multiple metal substrates are connected by countersunk holes and rivets to form the self-encapsulated structure. In another alternative embodiment, the multiple metal substrates are connected by soldering to form the self-encapsulated structure.

In an embodiment, the thickness of each metal substrate can be freely set according to the actual demand, and the metal substrate is made by processing aluminum, copper, or other alloys through metal etching and other processes.

Figure 2:
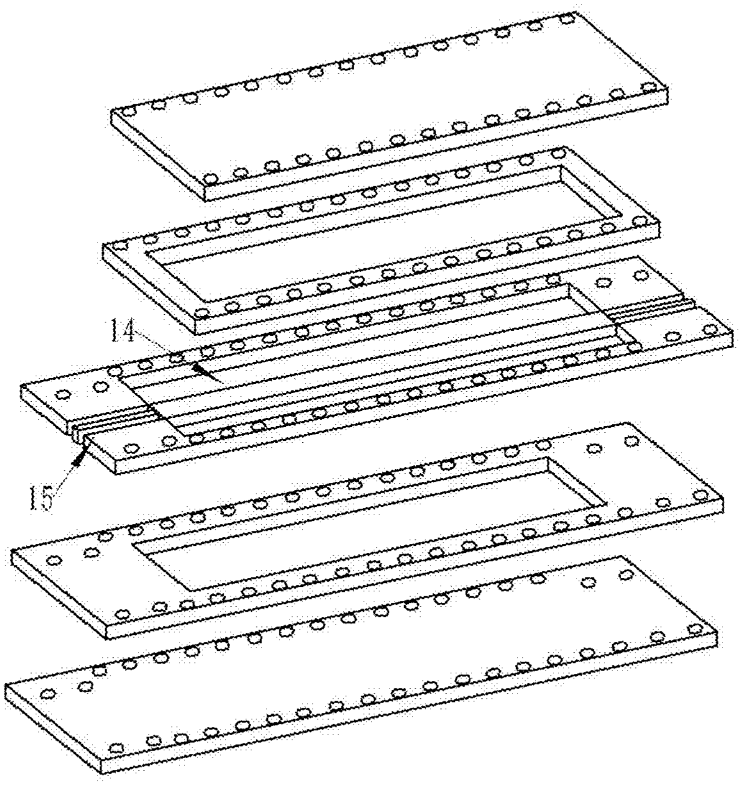
FIG. 2 illustrates a schematic structural diagram of a transmission line and a coaxial feeder in a metal-integrated suspended line according to an embodiment of the present disclosure.

FIG. 2 illustrates a transmission line structure based on the metal-integrated suspended line structure. Based on this transmission line structure, RF microwave circuits such as couplers, power splitters and others can be designed to realize the transmission line structure 14 (i.e., suspended transmission line). A coaxial feed line structure 15 (i.e., coaxial feeder) can be utilized to feed the circuits.

Figure 3:
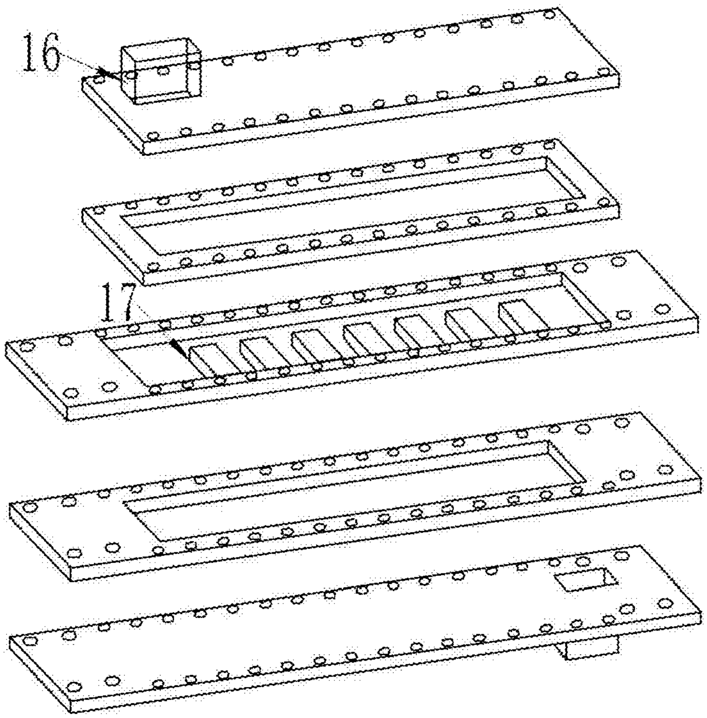
FIG. 3 illustrates a schematic structural diagram of a resonator-type filter and a waveguide-fed structure in a metal-integrated suspended line according to an embodiment of the present disclosure.

FIG. 3 illustrates a resonator structure based on the metal-integrated suspended line structure, such as using various metal sheets or column resonators and utilizing them to design coaxial-like line filters 17, duplexers, and the like. It is also possible to design various types of slotlines and the like by etching slots on the metal substrate 3. The resonator structure may also be directly fed using coaxial feed lines or a feed waveguide 16.

Figure 4:
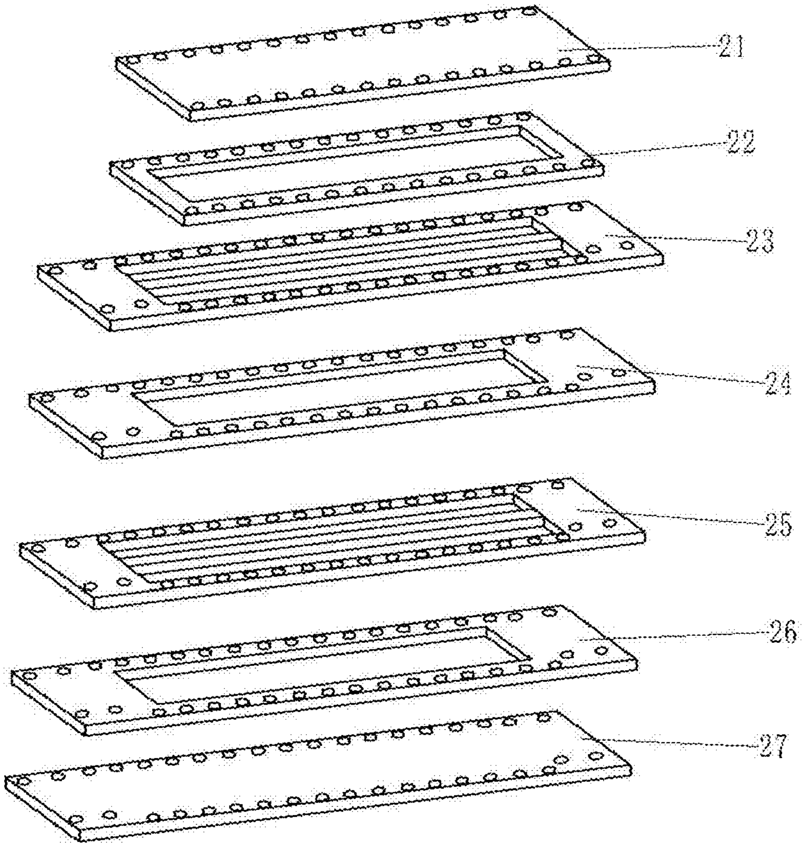
FIG. 4 illustrates a schematic structural diagram of a metal-integrated suspended line with seven-layer metals according to an embodiment of the present disclosure.

FIG. 4 illustrates a multilayer stacking structure based on a metal-integrated suspended line that enables vertical integration of circuits. The metal-integrated suspended line has a seven-layer circuit structure illustrated in FIG. 4, and the seven-layer circuit structure includes a metal substrate 21, a metal substrate 22, a metal substrate 23, a metal substrate 24, a metal substrate 25, a metal substrate 26, and a metal substrate 27 sequentially arranged in that order from top to bottom, which allows for the integration of any number of layers of circuits.

In the seven-layer circuit structure described above, each metal substrate defines multiple metallized through holes. The metal substrate 22, the metal substrate 24 and the metal substrate 26 each define air-filled hollow cavities. The metal substrate 23 and the metal substrate 25 are suspended line layers to set main circuits as illustrated in FIG. 2 and FIG. 3.

It should be noted that in the present disclosure, the number of metal substrates may be 5 as shown in FIGS. 1, 2 and 3, or 7 as illustrated in FIG. 4 or more. And specifically, it is not limited to the given embodiments.

The foregoing is only a preferred embodiment of the present disclosure, and it should be noted that for a person of ordinary skill in the art, a number of improvements and embellishments may be made without departing from the principles of the present disclosure, and these improvements and embellishments should also be regarded as the scope of protection of the present disclosure.

What is claimed is:

1. A metal-integrated suspended line, comprising: a plurality of metal substrates stacked from top to bottom and connected by rivets or screws to form a self-encapsulating structure; wherein the plurality of metal substrates comprise a top metal substrate located at a top of the plurality of metal substrates and a bottom metal substrate located at a bottom of the plurality of metal substrates; at least two metal substrates of the plurality of metal substrates except the top metal substrate and the bottom metal substrate are spaced apart from each other, and each of the at least two metal substrates defines an air-filled hollow cavity; and one of the plurality of metal substrates disposed between two hollow cavities of two of the at least two metal substrates is provided with a circuit structure;

wherein the circuit structure comprises a plurality of coaxial line filters; and the plurality of the coaxial line filters are spaced apart from each other and disposed on a side of an additional air cavity defined on the one metal substrate; and wherein a feed waveguide is provided at a top of the top metal substrate.

2. The metal-integrated suspended line as claimed in claim 1, wherein an end of each of the plurality of coaxial line filters is connected to an inner wall of the one metal substrate surrounding the additional air cavity in a lengthwise direction of the additional air cavity, and another end of each of the plurality of coaxial line filters opposite to the end of each of the plurality of coaxial line filters is spaced apart from another inner wall of the one metal substrate surrounding the additional air cavity in the lengthwise direction of the additional air cavity.

* * * * *